(12) United States Patent
Bang

(10) Patent No.: US 9,217,562 B2
(45) Date of Patent: Dec. 22, 2015

(54) ORGANIC LIGHT EMITTING DIODE DISPLAY

(71) Applicant: LG DISPLAY CO., LTD., Seoul (KR)

(72) Inventor: Jin-Young Bang, Gumi-si (KR)

(73) Assignee: LG DISPLAY CO., LTD., Seoul (KR)

( * ) Notice: Subject to any disclaimer, the term of this patent is extended or adjusted under 35 U.S.C. 154(b) by 208 days.

(21) Appl. No.: 13/958,013

(22) Filed: Aug. 2, 2013

(65) Prior Publication Data

US 2014/0103809 A1  Apr. 17, 2014

(30) Foreign Application Priority Data

Oct. 16, 2012  (KR) .......... 10-2012-0114850

(51) Int. Cl.
*H01L 51/52*  (2006.01)
*F21V 29/00*  (2015.01)

(52) U.S. Cl.
CPC ............ *F21V 29/004* (2013.01); *H01L 51/529* (2013.01)

(58) Field of Classification Search
CPC . H01L 27/32; H01L 27/3244; H01L 27/1225; H01L 27/1214; H01L 51/529; H01L 51/0005; H01L 23/3677
USPC .............................................. 315/113; 345/76
See application file for complete search history.

(56) References Cited

U.S. PATENT DOCUMENTS

2005/0012445 A1* 1/2005 Yamazaki et al. ............ 313/500
2007/0103407 A1* 5/2007 Koh et al. ....................... 345/76

* cited by examiner

*Primary Examiner* — John Poos
(74) *Attorney, Agent, or Firm* — Birch, Stewart, Kolasch & Birch, LLP

(57) ABSTRACT

An organic light emitting diode (OLED) display according to an embodiment includes an organic light emitting diode panel configured to display images, a back cover attached to the organic light emitting diode panel by an adhesive layer, a driving circuit board disposed at a rear surface side of the back cover, and a heat radiator disposed between the driving circuit board and the organic light emitting diode panel, so as to redirect heat generated from the driving circuit board away from the organic light emitting diode panel.

20 Claims, 10 Drawing Sheets

US 9,217,562 B2

ORGANIC LIGHT EMITTING DIODE DISPLAY

The present application claims the priority benefit of Korean Patent Application No. 10-2012-0114850 filed in Republic of Korea on Oct. 16, 2012, which is hereby incorporated by reference in its entirety.

BACKGROUND

1. Field of the Disclosure

The present disclosure relates to an organic light emitting diode display.

2. Discussion of the Related Art

With the advancement of information society, demand for a display device capable of displaying an image has increased in various forms. Recently, various flat panel display devices, such as a liquid crystal display (LCD), a plasma display panel (PDP), and an organic light emitting diode (OLED) display, have been used.

An OLED display has been widely used because of advantages of small size, lightweight, thin profile, low power consumption and the like.

An active matrix type OLED display is generally used which has pixels arranged in a matrix form where each pixel includes a switching transistor.

The related art OLED display includes a display panel, a driving circuit board, and a back cover therebetween.

The display panel acts as a heat source, and thus a temperature of the display panel rises with the display operation thereof. Further, the driving circuit board acts as a heat source as well. In particular, a control board, on which a plurality of circuit components, are mounted radiates much heat.

The heat from the control board is transferred to the display panel located in front, and a temperature of a portion of the display panel in front of the control board rises higher than other portions of the display panel. Therefore, the portion of the display panel in front of the control board is damaged or degraded very fast, and hot spot is thus caused there which deteriorates the performance of the display panel.

SUMMARY OF THE INVENTION

Accordingly, the present invention is directed to an OLED display capable of effectively radiating heat produced by a driving circuit.

The present invention is further directed to an OLED display having specific structures which address the limitations and disadvantages associated with the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an organic light emitting diode (OLED) display according to an embodiment includes an organic light emitting diode panel; a back cover attached to the organic light emitting diode panel by an adhesive; a driving circuit board on a rear surface of the back cover; and a heat radiator which covers the driving circuit board, and around which the adhesive is located in plane view.

In another aspect, an organic light emitting diode (OLED) display includes an organic light emitting diode panel; a back cover on a rear surface of the organic light emitting diode panel; a driving circuit board on a rear surface of the back cover; and a metal plate or a heat radiation plate on a rear surface of the back cover and on which the driving circuit board is placed, wherein at least one of the back cover and the heat radiation plate includes a first heat spread unit and a heat insulation unit sequentially located in a direction to the organic light emitting diode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to exemplary embodiments, examples of which are illustrated in the accompanying drawings.

Figure 1:
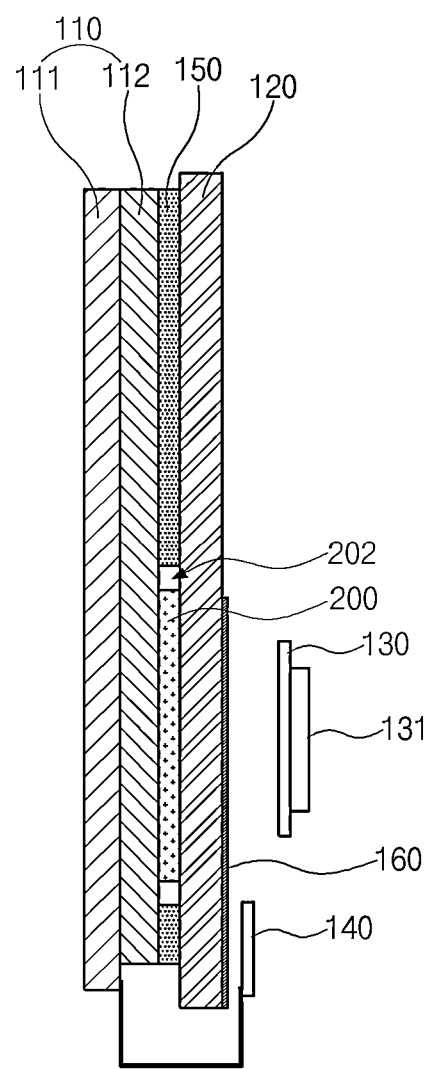
FIG. 1 is a schematic cross-sectional view illustrating an OLED display according to a first embodiment of the present invention.
Figure 2:
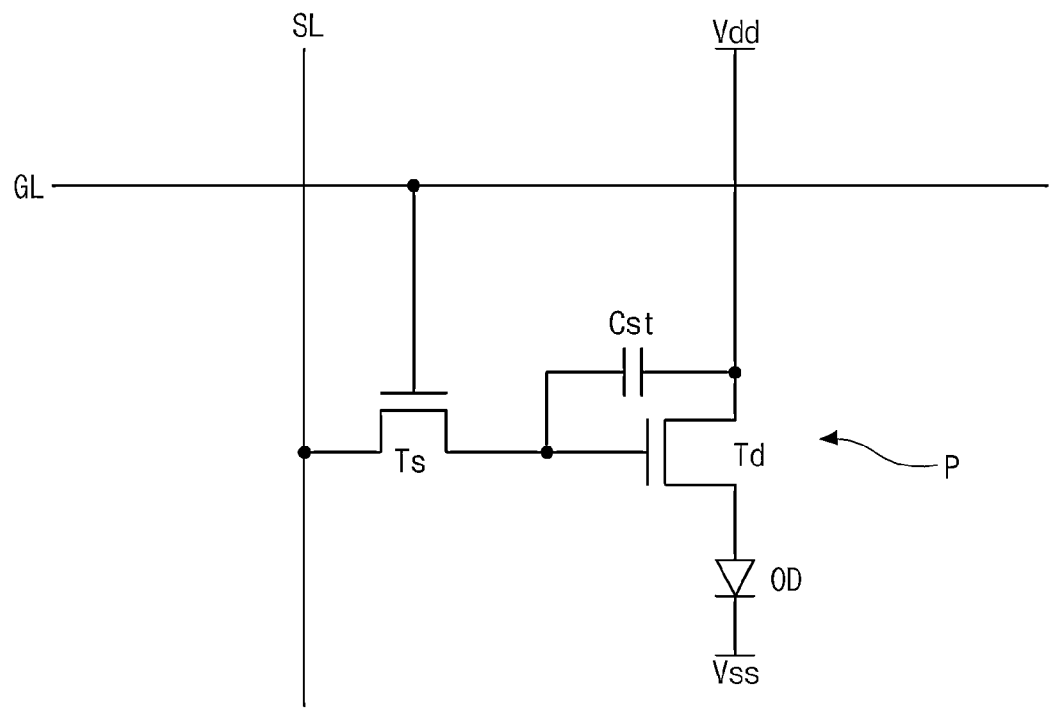
FIG. 2 is a schematic circuit diagram of a pixel of a display panel of the OLED display according to the first embodiment of the present invention.
Figure 3:
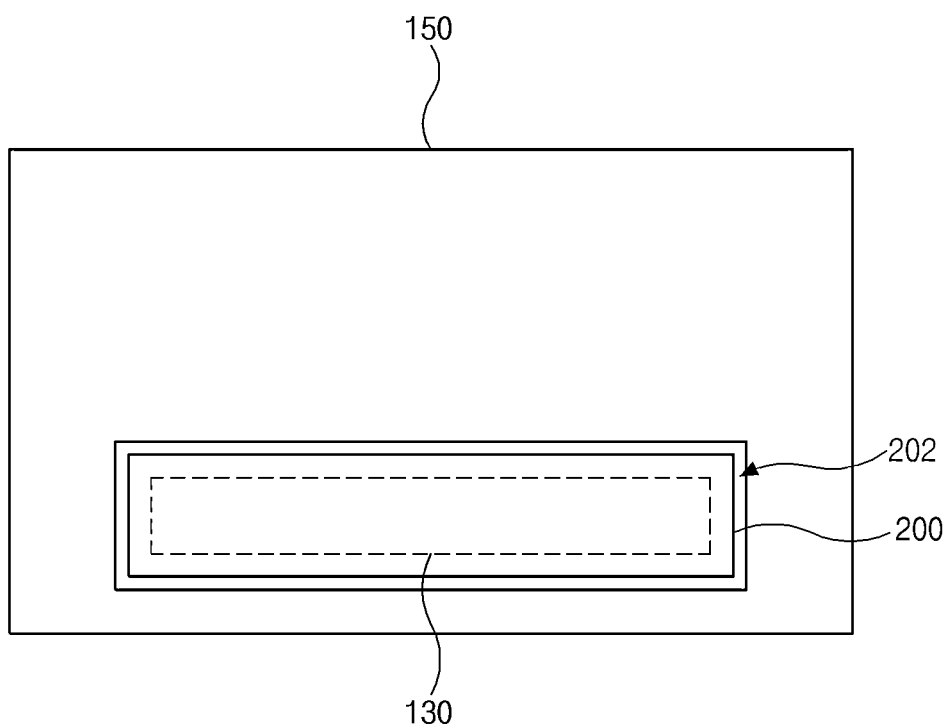
FIG. 3 is a schematic plan view illustrating a heat radiator and an adhesive according to the first embodiment of the present invention.
Figure 4:
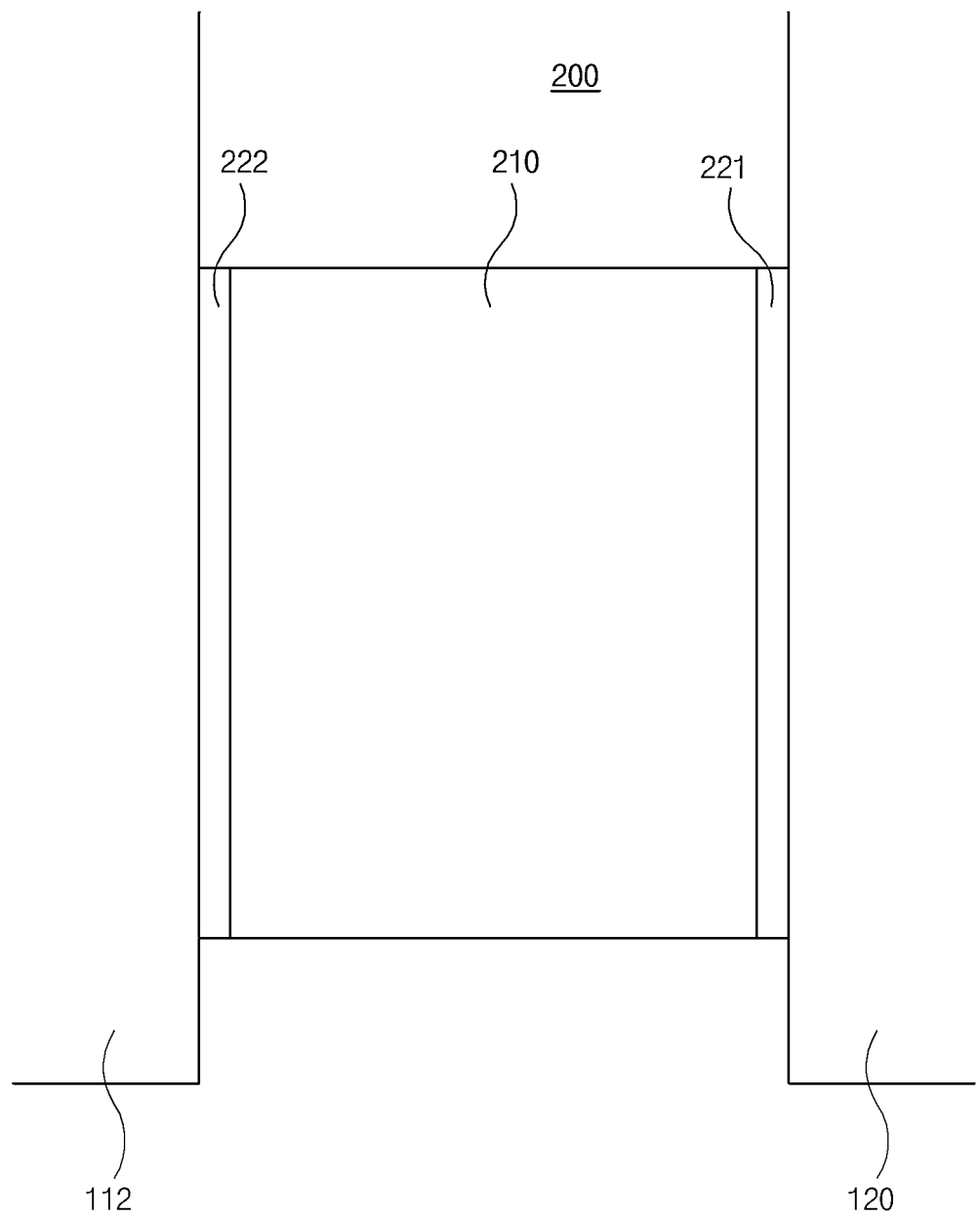
FIG. 4 is a schematic cross-sectional view illustrating the heat radiator according to the first embodiment of the present invention.
Figure 5:
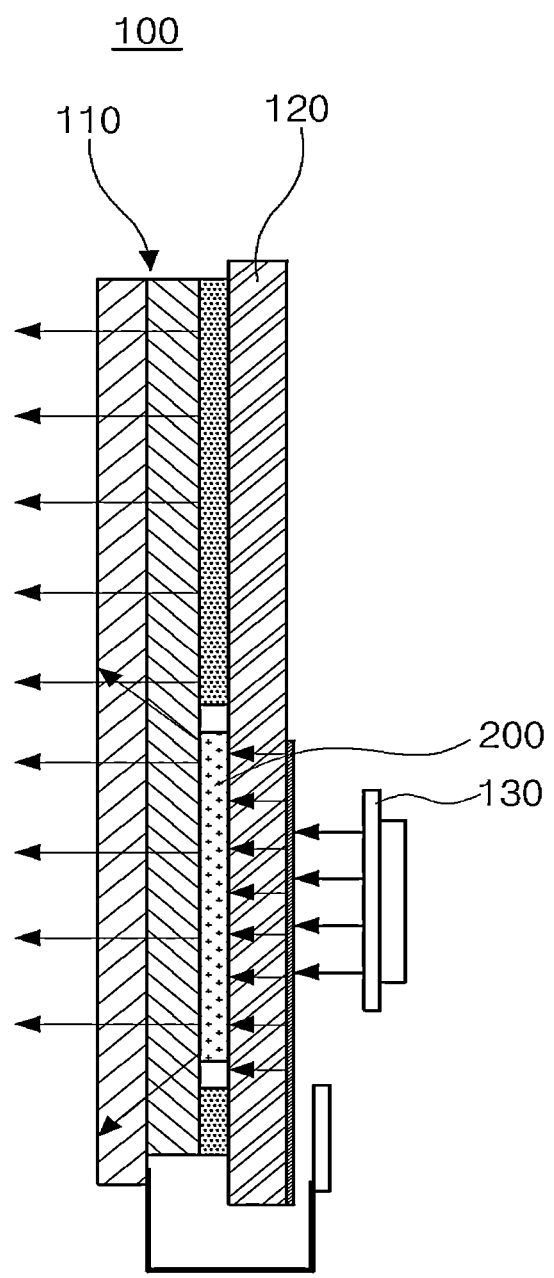
FIG. 5 is a schematic view illustrating a heat transfer path of a heat produced by a control board according to the first embodiment of the present invention.

FIG. 1 is a schematic cross-sectional view illustrating an OLED display according to a first embodiment of the present invention, FIG. 2 is a schematic circuit diagram of a pixel of a display panel of the OLED display according to the first embodiment of the present invention, FIG. 3 is a schematic plan view illustrating a heat radiator and an adhesive according to the first embodiment of the present invention, FIG. 4 is a schematic cross-sectional view illustrating the heat radiator according to the first embodiment of the present invention, and FIG. 5 is a schematic view illustrating a heat transfer path of a heat produced by a control board according to the first embodiment of the present invention.

Referring to FIGS. 1 to 5, the OLED display includes an organic light emitting display panel 110, a back cover 120, a driving circuit board, and a heat radiator 200. All the components of the OLED display according to the first embodiment and any other embodiments of the present invention are operatively coupled and configured.

The organic light emitting diode panel 110 is a display panel to display images, and includes pixel regions P arranged in a matrix form. The organic light emitting diode panel 110 includes first and second substrates 111 and 112 facing each other.

The organic light emitting diode panel 110 can be configured to be one type among various types. For example, a bottom emission type panel, which emits light toward an array substrate having thin film transistors, or a top emission type panel, which emits light toward an opposing substrate facing an array substrate, may be used as the organic light emitting diode panel 110. Further, a panel which includes both the thin film transistors and organic light emitting diodes formed at an array substrate, or a panel which includes thin film transistor and organic light emitting diode formed at different substrates is used as the organic light emitting diode panel 110.

For the purposes of explanation, in one example, the organic light emitting diode panel 110 of the embodiment emits light toward an array substrate and is formed at the array substrate together with organic light emitting diodes.

The first substrate 111 may be an array substrate, and the second substrate 112 may be an encapsulation substrate that functions to seal the first substrate 111. In this case, an image produced by the organic light emitting diode panel 110 is emitted toward the first substrate 111. That is, an outer surface (exposed surface) of the first substrate 111 is a display surface of the organic light emitting diode panel 110, which is viewed by users.

Referring to FIG. 2, the first substrate 111 includes gate and source lines GL and SL crossing each other to define a plurality of pixel regions P. The gate and source lines GL and SL are formed on an inner surface of the first substrate 111. In each pixel region P, a switching transistor Ts, a driving transistor Td, a capacitor Cst, and an organic light emitting diode OD are formed in the first substrate 111.

For each pixel region P, the switching transistor Ts is connected to the corresponding gate and source lines GL and SL. A gate electrode of the driving transistor Td is connected to a drain electrode of the switching transistor Ts. The organic light emitting diode OD is connected to a drain electrode of the driving transistor Td. The capacitor Cst is connected between the source and gate electrodes of the driving transistor Td.

The switching transistor Ts is turned on by a gate voltage applied to the corresponding gate line GL, and in synchronization therewith, a source voltage applied to the corresponding source line SL is supplied to the gate electrode of the driving transistor Td. Accordingly, the driving transistor Td is turned on, and a current is produced according to an amplitude of the source voltage and flows to the organic light emitting diode OD. Accordingly, the organic light emitting diode OD emits light for displaying images.

Pads are formed at a non-display region on the inner surface which is located outside the display region of the panel 110. The pads are supplied with driving signals, such as the source voltage and the gate voltage, that operate the organic light emitting diode panel 110.

The back cover 120 is located at the back of the organic light emitting diode panel 110. The organic light emitting diode panel 110 may be attached to the back cover 120 with an adhesive 150. A double-sided adhesive tape may be used as the adhesive 150.

The back cover 120 functions to support and protect the rear of the organic light emitting diode panel 110. To do this, the back cover 120 may be made of a composite material, which may be FRP (Fiber Reinforced Plastic), for example, CFRP (Carbon Fiber Reinforced Plastic), or GFRP (Glass Fiber Reinforced Plastic).

Further, a front cover may be provided in front of the organic light emitting diode panel 110 having a frame-like shape.

The driving circuit board is located on the rear surface of the back cover 120. The driving circuit board is used to operate the organic light emitting diode panel 110 and includes a control board 130 and at least one of a source driving board 140 and a gate driving board.

Circuit components 131 including a timing controller are mounted on the control board 130. The control board 130 produces signals to operate the source driving board 140 and the gate driving board, and outputs the signals to the source driving board 140 and the gate driving board.

The source driving board 140 and the gate driving board produce driving signals according to the signals input thereto, and output the signals to the corresponding pads of the organic light emitting diode panel 110.

A metal plate 160 may be located between the back cover 120 and the driving circuit board, and the driving circuit board is located on the rear surface of the metal plate 160. The metal plate 160 is attached to the rear surface of the back cover 120, and has a size to cover the driving circuit board in plane view. The size of the metal plate 160 is less than the size of the back cover 120. For instance, the metal plate 160 covers only a portion of the back cover 120.

The metal plate 160 may be made of a good corrosion-resistant material, for example, EGI (Electrolyte Galvanized Iron). Further, the metal plate 160 may be of a material that allows the metal plate 160 to function as a second heat radiator.

The heat radiator 200 is used to effectively radiate heat produced from the driving circuit board and is located between the organic light emitting diode panel 110 and the back cover 120. For the purpose of explanation, the heat radiator 200 is configured to fully correspond to the control board 130. For instance, the size of the heat radiator 200 is large enough to cover at least the control board 130 fully.

Referring to FIG. 3, the heat radiator 200 is located to correspond to the control board 130 functioning as a heat source, and the adhesive 150 is provided around the heat radiator 200 but not on the heat radiator 200. Depending on the shape of the control board 130, the shape of the radiator 200 may change to correspond to it. In this example, both the control board 130 and the radiator 200 have rectangle shapes. A space 202 may be provided between the outline of the inner opening of the adhesive 150 and the outline of the heat radiator 200. That is, the adhesive 150 is provided to surround the heat radiator 200 but is positioned coplanar with (or substantially coplanar with) the heat radiator 200.

Accordingly, the heat radiator 200 and the adhesive 150 as well are located between the organic light emitting diode panel 110 and the back cover 120.

As shown in FIG. 1, in order to place the heat radiator 200 and the adhesive 150 at the same layer in a cross-sectional view (e.g., in order for the heat radiator 200 and the adhesive 150 to be disposed coplanar to each other), a portion of the adhesive 150 may be removed and the heat radiator 200 may be formed in the removed portion of the adhesive 150. As a result, the space 202 may be formed between the heat radiator 200 and the exposed opening surface of the adhesive 150.

In one example, it is preferred that a thickness of the heat radiator 200 is less than that of the adhesive 150. In other examples, the thickness of the heat radiator 200 may be equal to or substantially the same as the thickness of the adhesive 150.

According to the configuration of the heat radiator 200 and the adhesive 150, the heat radiator 200 can be positioned at a location corresponding to the control board 130 without an increase of thickness to the OLED display.

The heat radiator 200 is configured to have a size large enough to fully cover the control board 130 in plan view as shown in FIG. 3. For example, the heat radiator 200 has the area that is less than the area of a region where the organic light emitting diode panel 110 is attached to the back cover 120, but the area of the heat radiator 200 is equal to or less than the area of the control board 130. FIG. 3 shows an example where the size of the heat radiator 200 is larger than the size of the control board 130 so that the heat radiator 200 in plan view fully encompasses the control board 130. In another variation, the adhesive layer 150 may not completely surround the heat radiator 200. Instead, the adhesive layer 150 may surround only a portion of the heat radiator 200. For instance, the adhesive layer 150 may surround only two or three sides of the heat radiator 200. Further, the space 202 is provided to further mitigate heat transfer from the driving circuit board 130. Moreover, depending on the location of the driving circuit board 130 with respect to the display panel 110, the location of the heat radiator 200 may change. In addition, the shape and size of the heat radiator 200 may vary according to the size and shape of the driving circuit board 130. For instance, outer surface areas of the heat radiator 200 can include protrusions to enhance the heat radiation operation. Also although one heat radiator 200 is shown in FIG. 3, it is possible to have multiple heat radiators 200 to accommodate heat transfer from the driving circuit board 130. One or more features associated with the heat radiator 200 can be equally applied to one or more other radiators of the present invention (e.g., radiator 300) described below.

Regarding the area of the heat radiator 200, it is preferred that it is about 27% to about 38.5% of the area of the region where the organic light emitting diode panel 110 is attached to the back cover 120. Here, in one example, the area of the region where the organic light emitting diode panel 110 is attached to the back cover 120 may be the same size as or has a similar size as the size of the adhesive 150.

The heat radiator 200 may be made of a good heat-conductive material, for example, graphite of high heat conductivity in plane direction.

Although the heat radiator 200 may be formed of a single layer, the heat radiator 200 may have a multiple-layered structure. Referring to FIG. 4, the heat radiator 200 may include a heat radiating layer 210 that functions to radiate heat, and first and second adhesive layers 221 and 222 at the opposite surfaces of the heat radiating layer 210. The heat radiator 200 can be attached to both of the organic light emitting diode panel 110 and the back cover 120 through the first and second adhesive layers 221 and 222. For instance, the back surface of the substrate 112 of the panel 110 may be attached to the second adhesive layer 222 while the front surface of the back cover 120 may be attached to the first adhesive layer 221, or vice versa.

The thickness of the heat radiating layer 210 substantially defines the thickness of the heat radiator 200. For example, the thickness of the heat radiation layer 210 may be about 90% of the thickness of the heat radiator 200 or more.

As described above, by placing the heat radiator 200 in front of the control board 130, the transfer of the heat, which radiates from the control board 130 to the front, to the organic light emitting diode 110 is reduced significantly. As a result, the rise of temperature of the organic light emitting diode panel 110 due to the heat from the control board 130 can be suppressed or minimized.

In this regard, referring to FIG. 5, according to the present invention, heat produced from the control board 130 towards the front of the OLED display is spread in side directions by the heat radiator 200. Accordingly, the heat transferred to the organic light emitting diode panel 110 in front of the control board 130 can be reduced much compared to the related art.

In the first embodiment, the heat radiator 200 has the area to cover a part of the organic light emitting diode panel 110 corresponding to the control board 130. Even though such a relatively small-sized heat radiator 200 is used, heat radiation can be sufficiently made.

This is explained with reference to FIG. 6, which respectively illustrates examples of measured temperatures of organic light emitting diode panels of the related art, a comparative example and the first embodiment of the present invention.

Figure 6:
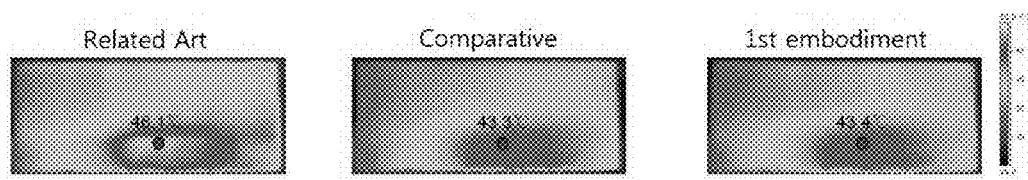
FIG. 6 is a view showing examples of measured temperatures of organic light emitting diode panels of the related art, a comparative example and the first embodiment of the present invention.

In FIG. 6, the related art organic light emitting diode panel does not use a heat radiator, and the comparative example uses a heat radiator that is attached to the entire surface of an organic light emitting diode panel. Here the comparative example is part of one example of the present invention.

Referring to FIG. 6, a maximum temperature of a portion of an organic light emitting diode panel in front of a control board in the related art organic light emitting diode panel is about 46.1 degrees Celsius. In contrast, a maximum temperature in the comparative example of the present invention is about 43.3 degrees Celsius, and a maximum temperature in the first embodiment of the present invention is about 43.4 degrees Celsius.

Accordingly, the organic light emitting diode panels of the comparative example and the first embodiment using a heat radiator of the present invention in comparison have a panel temperature that is reduced by about 2 or 3 degrees Celsius less than that of the related art organic light emitting diode panel.

Further, in this example, the first embodiment having a heat radiator only partially covering the back cover 120 has substantially the same effect in the reduction of panel temperature as the comparative example having a heat radiator entirely covering the back cover 120 of the present invention.

As such, the first embodiment of the present invention has a good heat radiation control, which is substantially the same as the comparative example of the present invention.

Therefore, according to the first embodiment, by placing the heat radiator in front of the control board, good heat radiation control can be achieved which improves the performance of the OLED display. Further, using the heat radiator partially covering the back cover, cost for the panel can be reduced.

Figure 7:
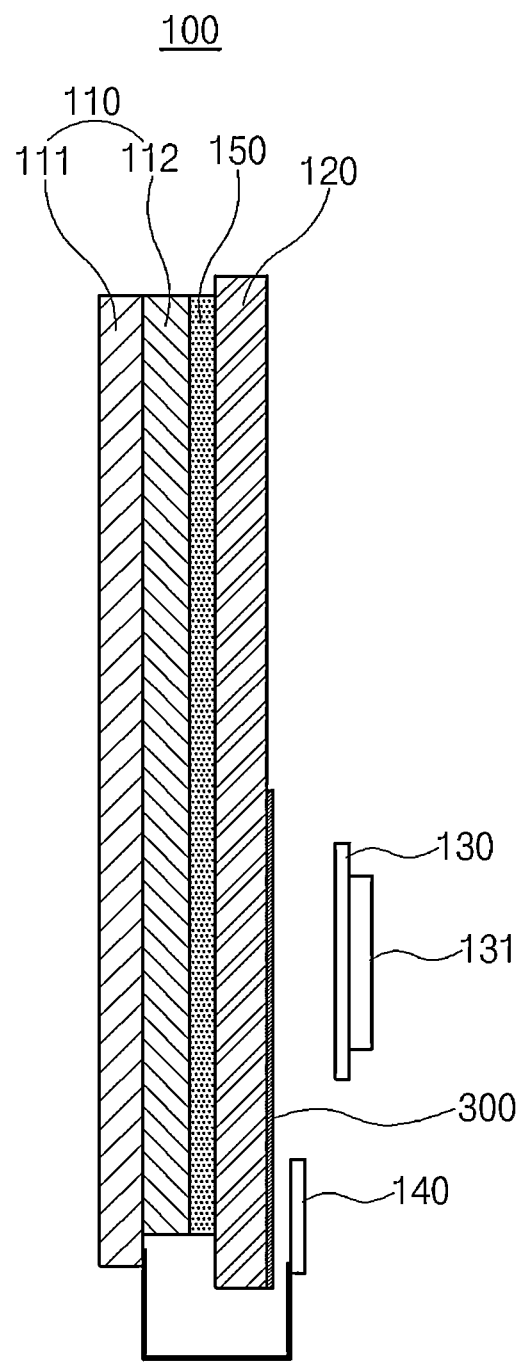
FIG. 7 is a schematic cross-sectional view illustrating an OLED display according to a second embodiment of the present invention.
Figure 8:
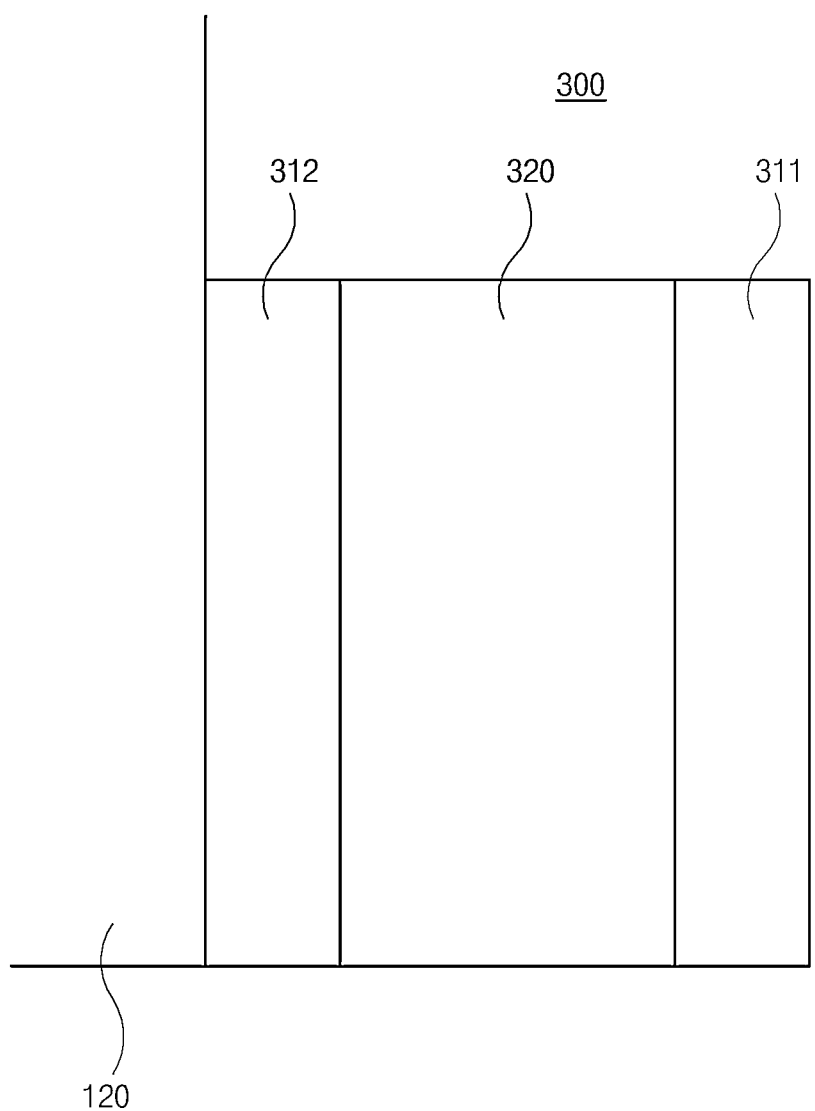
FIG. 8 is a schematic cross-sectional view illustrating a heat radiation plate according to the second embodiment of the present invention.
Figure 9:
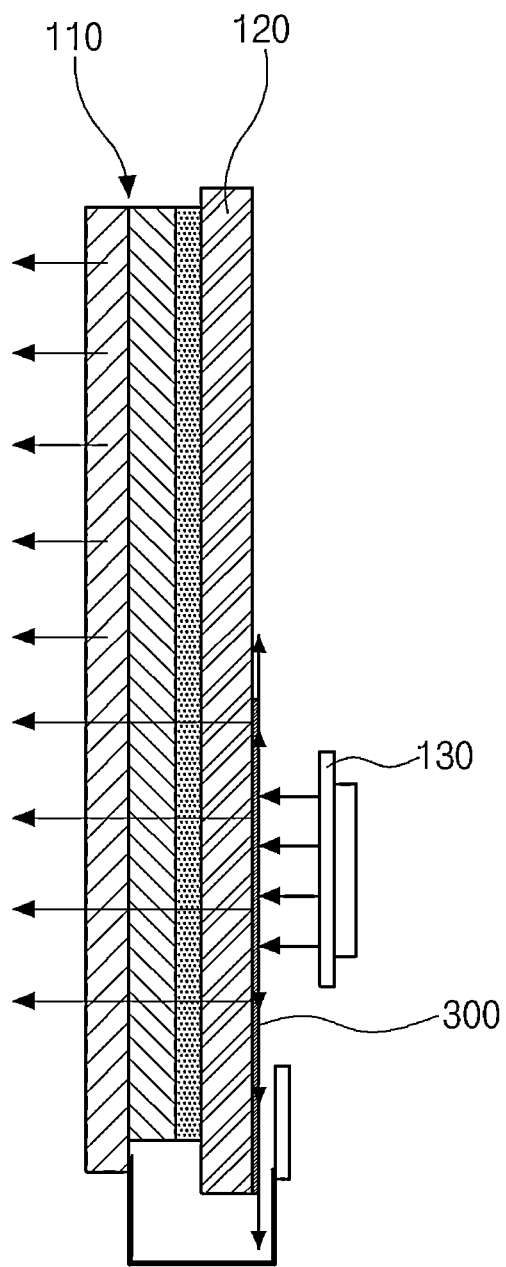
FIG. 9 is a schematic view illustrating a heat transfer path of a heat produced by a control board according to the second embodiment of the present invention.

FIG. 7 is a schematic cross-sectional view illustrating an OLED display according to a second embodiment of the present invention, FIG. 8 is a schematic cross-sectional view illustrating a heat radiation plate according to the second embodiment of the present invention, and FIG. 9 is a schematic view illustrating a heat transfer path of a heat produced by a control board according to the second embodiment of the present invention.

Explanations of parts similar to (or same as) the parts of the first embodiment may be omitted or brief for the sake of brevity.

Referring to FIGS. 7 to 9, the OLED display includes an organic light emitting diode panel 110, a back cover 120, a driving circuit board, and a heat radiation plate (radiator) 300.

In the second embodiment, the organic light emitting diode panel 110 and the back cover 120 are coupled to each other through an adhesive 150. In other words, in a way different from the first embodiment, the adhesive 150 is configured to attach to the entire back surface of the organic light emitting diode panel 110.

Further, the heat radiation plate 300 may be employed instead of the metal plate 160 of FIG. 1. That is, the heat radiation plate 300 may be located between the back cover 120 and the driving circuit board. The heat radiation plate 300 may be attached to the back surface of the back cover 120 using an adhesive.

The heat radiation plate 300 may have a size to fully cover the driving circuit board in plan view. For example, the size of the heat radiation plate 300 may be equal to or greater than the of the control board 130, but may be less than the size of the back cover 120.

The heat radiation plate 300 may have a multiple-layered structure that includes at least one heat spread means and at least one heat insulation means. Here, each of the hot spread means and the heat insulation means can be one or more layers, structures, units, materials, regions, etc. In this case, it is preferred that the heat spread means is positioned closer to the control board 130 than the heat insulating means is. In other words, it is preferred that, in front of the control board 130, the heat spread means is positioned before the heat insulating means or is more immediately disposed adjacent to the control board 130 than the heat insulating means is adjacent to the control board 130.

In this regard, FIG. 8 shows an example of the heat radiation plate 300 including two heat spread means 311 and 312 and one heat insulation means 320. The heat spread means 311 and 312 can be layers that spread heat effectively. The heat insulating means 320 can be a layer that insulates heat.

The first heat spread means 311, the heat insulation means 320 and the second heat spread means 312 are sequentially located in a direction to the organic light emitting diode panel 110. In other words, the first heat spread means 311 is located between the control board 130 and the heat spread means 320, and the second heat spread means 312 is located between the back cover 120 and the heat spread means 320.

The heat insulation means 320 may be made of a material that has a low heat conductivity of about 0.1 W/mK to about 0.5 W/mK. For example, polyethylene (PE) may be used for the heat insulation means 320. The PE has advantages, such as lightweight, high shock resistance, high resistance to humidity and low temperature, low conductivity, and thermoplasticity.

The first and second heat spread means 311 and 312 may be made of a material that has a high heat conductivity of about 100 W/mK or more. For example, aluminum (Al) or copper (Cu) may be used for the first and second heat spread means 311 and 312.

The heat insulation means 320 may be thicker than each of the first and second heat spread means 311 and 312. For example, when the heat radiation plate 300 has a thickness of about 1.0 mm to about 8.0 mm, each of the first and second heat spread means 311 and 312 may have a thickness of about 0.2 mm to about 0.5 mm.

By placing the heat radiation plate (radiator) 300 in front of the control board 130 but behind the back cover 120, the heat transferred to a portion of the organic light emitting diode panel 110 from the control board 130 is reduced significantly. For instance, the first heat spread means 311 spreads heat from the driving circuit board 130, the second heat spread means 312 spreads heat from the display panel 110, and the heat insulating means 320 insulates heats from the first and second spread means 311 and 312. As a variation, only one of the first and second heat spread means 311 and 312 may be provided in the heat radiation plate 300.

In this regard, referring to FIG. 9, the heat produced from the control board 130 towards the front of the OLED display is spread outwardly and effectively in side directions along the first heat spread means 311 of the heat radiation plate 300.

In other words, since the heat insulation means 320 is positioned in front of the first heat spread means 311, the heat transfer of the heat from the control board 130 in the front direction is most blocked or reduced, and the heat emitting from the control board 130 to the front thereof is spread in a plane direction of the heat radiation plate 300.

Further, by using the second heat spread means 312, the heat transfer in the plane direction of the heat radiation plate 300 can be improved more.

Accordingly, the heat transferred to the portion of the organic light emitting diode panel 110 in front of the control board 130 can be much reduced compared to the related art.

Further, by placing the heat radiation plate 300 directly in front of the control board 130, temperature increase due to the circuit components of the control board 130 can be reduced or minimized.

The structure of the heat radiation plate 300 may be applied to the back cover 120. For example, by configuring the back cover 120 using the heat spread means and the heat insulating means similar to the heat radiation plate 300, the back cover 120 can acts as a heat radiation cover as well. In this case, it is preferred that, in front of the control board 130, the heat spread means of the back cover 120 is positioned before (or closer to the adhesive layer 150 than) the heat insulation means of the back cover 120. The entire back cover 120 may be divided into the heat spread means and the heat insulating means, or only a portion of the back cover 120 corresponding to the control board 130 may be divided into the heat spread means and the heat insulating means. Other variations are possible. Further, when the back cover 120 is used as a heat radiation cover, the heat radiation cover 300 may be used together, and/or the metal plate of the first embodiment may be employed.

Additionally, multiple heat radiation plates 300 (or any other radiator such as 200) can be stacked adjacent to each other between the control board 130 and the back cover 120. For instance, in such a case where two heat radiation plates 300 are disposed adjacent to each other, the first means 311 of the first heat radiation plate 300 directly contacts the second means 312 of the second heat radiation plate 300.

Figure 10:
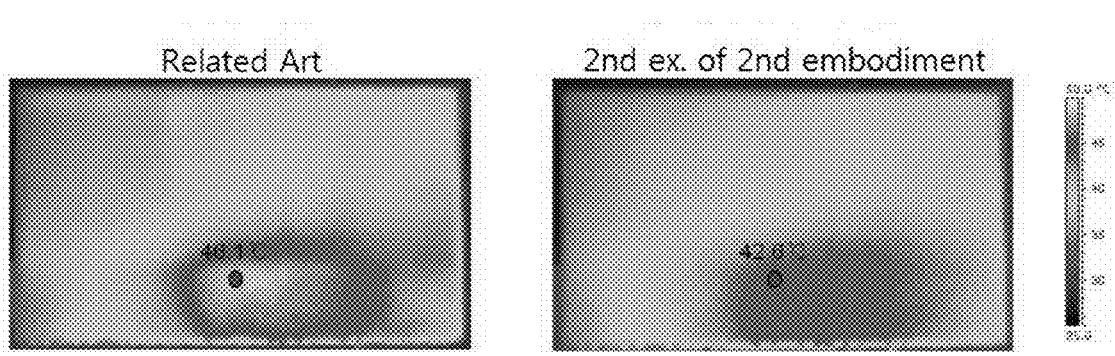
FIG. 10 is a view showing examples of measured temperatures of organic light emitting diode panels of the related art and the second embodiment of the present invention.

FIG. 10 is a view illustrating examples of measured temperatures of organic light emitting diode panels of the related art and the second embodiment of the present invention.

Table 1 below also shows examples of maximum temperatures of organic light emitting diodes, and temperatures of circuit components of control boards, of the related art and the second embodiment of the present invention.

TABLE 1

|  | Related art | 1st example of the 2nd embodiment of the invention | 2nd example of the 2nd embodiment of the invention |
| --- | --- | --- | --- |
| maximum temp. (Celsius) | 46.1 | 43.4 | 42.6 |
| temp. of circuit component (Celsius) | 55.9 | 55.6 | 55.2 |

The first example of the second embodiment of the present invention uses the heat radiation plate and the back cover made of composite material, and the second example of the second embodiment of the present invention uses the heat radiation plate and the back cover of a structure similar to the heat radiation plate.

Referring to FIG. 10 and above Table 1, the maximum temperature of a portion of the organic light emitting diode in front of the control board in the related art is about 46.1 degrees Celsius. The maximum temperature of the first example of the second embodiment of the present invention is about 43.4 degrees Celsius, and the maximum temperature of the second example of the second embodiment of the present invention is about 42.6 degrees Celsius.

As such, the temperature of the organic light emitting diode panel of the second embodiment of the present invention is clearly reduced by about 2 degrees to 4 degrees less than that of the related art. Accordingly, the second embodiment provides a good heat radiation control.

Further, the temperature of the circuit component of the second embodiment is reduced less than that of the related art. Accordingly, the second embodiment provides a reduction in the output temperature of the circuit components of the OLED display.

The first and second embodiments are separately explained as above. However, the first and second embodiments may be combined. For example, the heat radiator of the first embodiment, and at least one of the heat radiation plate and the back cover acting to heat-radiate of the second embodiment may be combined. For instance, to the OLED display structure of FIG. 7, the adhesive layer 150 of FIG. 7 may be replaced with the combination structure of the adhesive layer 150 and the heat radiator 200 of FIG. 1.

In the embodiments as above, a heat radiator is positioned partially in front of a back cover corresponding to a driving circuit board. Therefore, a good heat radiation for the driving circuit board can be achieved, and the cost of the OLED display thereby can be reduced.

Further, according to the embodiments of the present invention, a heat radiation plate including a heat spread means and a heat insulation means in front of a control board and/or a back cover having a structure similar to the heat radiation plate are used. Therefore, by the present invention, a good heat radiation for the driving circuit board of the OLED display can be achieved, and the temperature of a driving component of the driving circuit board of the OLED can be reduced. Moreover, the overall performance and lifespan of the OLED display improves since hot spots and other heat-related damages can be reduced or minimized.

It will be apparent to those skilled in the art that various modifications and variations can be made in a display device of the present disclosure without departing from the sprit or scope of the invention. Thus, it is intended that the present invention covers the modifications and variations of this invention provided they come within the scope of the appended claims and their equivalents.

What is claimed is:

1. An organic light emitting diode (OLED) display comprising:
   an organic light emitting diode panel configured to display images, the organic light emitting diode panel including a first substrate and a second substrate facing each other;
   a back cover attached to a lower surface of the second substrate by an adhesive layer;
   a driving circuit board disposed on a lower surface of the back cover, an upper surface of the back cover being attached to the lower surface of the second substrate; and
   a heat radiator with no holes and being disposed between the driving circuit board and the lower surface of the back cover, so as to redirect heat generated from the driving circuit board away from the organic light emitting diode panel.

2. The display of claim 1, wherein the heat radiator is disposed between the back cover and a rear surface of the organic light emitting diode panel.

3. The display of claim 2, wherein the adhesive layer encompasses the heat radiator.

4. The display of claim 3, wherein a space gap that surrounds the heat radiator is provided between the heat radiator and the adhesive layer.

5. The display of claim 2, wherein both a rear surface of the adhesive layer and a rear surface of the heat radiator contact a front surface of the back cover.

6. The display of claim 2, further comprising:
   a metal plate disposed between the back cover and the driving circuit board and functioning as a second heat radiator.

7. The display of claim 1, wherein the adhesive layer is attached to an entire rear surface of the organic light emitting diode panel, and
   the heat radiator is disposed between the back cover and the driving circuit board.

8. The display of claim 1, wherein the heat radiator includes a graphite, and has a thickness equal to or less than a thickness of the adhesive layer.

9. The display of claim 1, wherein the driving circuit board includes at least one of a control board, a source driving board and a gate driving board.

10. An organic light emitting diode (OLED) display comprising:
    an organic light emitting diode panel configured to display images;
    a back cover attached to the organic light emitting diode panel by an adhesive layer;
    a driving circuit board disposed at a rear surface side of the back cover; and
    a heat radiator disposed between the driving circuit board and the organic light emitting diode panel, so as to redirect heat generated from the driving circuit board away from the organic light emitting diode panel,
    wherein the heat radiator includes a first material layer and at least one second material layer, the first material layer being formed of a heat insulating material or a low heat conductivity material, the second material layer being formed of a heat spreading material or a high heat conductivity material.

11. The display of claim 10, wherein the at least one second material layer is two second material layers disposed on opposite surfaces of the first material layer.

12. The display of claim 10, wherein the at least second material layer includes aluminum or copper, and the first material layer includes a polyethylene (PE).

13. An organic light emitting diode (OLED) display comprising:

an organic light emitting diode panel configured to display images;
a back cover attached to the organic light emitting diode panel by an adhesive layer;
a driving circuit board disposed at a rear surface side of the back cover; and
a heat radiator disposed between the driving circuit board and the organic light emitting diode panel, so as to redirect heat generated from the driving circuit board away from the organic light emitting diode panel,
wherein the back cover includes a heat spread layer and a heat insulation layer sequentially located in a direction towards the organic light emitting diode panel.

14. An organic light emitting diode (OLED) display comprising:
an organic light emitting diode panel configured to display images;
a back cover disposed on a lower surface of the organic light emitting diode panel;
a driving circuit board disposed at a lower surface side of the back cover; and
a metal plate or a heat radiator with no holes and being disposed on a lower surface of the back cover and between the back cover and the driving circuit board,
wherein at least one of the back cover and the heat radiator includes a first heat spread layer with no holes and a heat insulation layer with no holes sequentially located in a direction from the driving circuit board to the organic light emitting diode panel.

15. The display of claim 14, wherein the first heat spread layer includes aluminum or copper, and the heat insulation layer includes a polyethylene (PE).

16. The display of claim 14, wherein the at least one of the back cover and the heat radiator further includes a second heat spread layer disposed adjacent to the heat insulation layer so that the heat insulation layer is disposed between the first and second heat spread layers.

17. The display of claim 14, wherein the driving circuit board includes at least one of a control board, a source driving board and a gate driving board.

18. The display of claim 14, further comprising:
an adhesive that attaches the organic light emitting diode panel to the back cover; and
another heat radiator which is disposed between the back cover and the organic light emitting diode panel.

19. The display of claim 18, wherein the adhesive surrounds the another heat radiator.

20. The display of claim 14, further comprising:
an adhesive provided on an entire rear surface of the organic light emitting diode panel.

\* \* \* \* \*